United States Patent [19]

Masaki

[11] Patent Number: 5,471,660
[45] Date of Patent: Nov. 28, 1995

[54] CHANNEL SELECTING METHOD FOR RADIO RECEIVER AND HIGHSPEED SCANNING TYPE RADIO RECEIVER

[75] Inventor: Tateo Masaki, Ichikawa, Japan

[73] Assignee: Uniden Corporation, Ichikawa, Japan

[21] Appl. No.: 177,728

[22] Filed: Jan. 5, 1994

[30] Foreign Application Priority Data

Jun. 18, 1993 [JP] Japan .................................. 5-147503

[51] Int. Cl.$^6$ ...................................................... H04B 1/26
[52] U.S. Cl. ...................... 455/161.2; 455/222; 455/296; 455/310
[58] Field of Search .............................. 455/161.1, 161.2, 455/161.3, 164.1, 164.2, 165.1, 166.1, 166.2, 167.1, 150.1, 255–260, 296, 310, 221–224

[56] References Cited

U.S. PATENT DOCUMENTS

| | | | |
|---|---|---|---|
| 3,619,788 | 11/1971 | Giles, Jr. et al. | 455/166.2 |
| 4,264,976 | 4/1981 | Yamashita | 455/161.2 |

FOREIGN PATENT DOCUMENTS

| | | | |
|---|---|---|---|
| 0026131 | 1/1990 | Japan | 455/296 |
| 3-154433 | 7/1991 | Japan. | |

*Primary Examiner*—Reinhard J. Eisenzopf
*Assistant Examiner*—Thanh Le
*Attorney, Agent, or Firm*—Ratner & Prestia

[57] ABSTRACT

A highspeed scanning type radio receiver is disclosed which prevents an erroneous interruption of a scanning operation caused by high frequency noises produced from a clock oscillator and a local oscillator circuit employed therein. The highspeed scanning type radio receiver includes a highspeed clock oscillator, a lowspeed clock oscillator, and a clock switching circuit for switching these highspeed clock oscillator and lowspeed clock oscillator to be connected to a CPU. Normally, a searching operation is carried out by supplying the highspeed clock to the microcomputer. When a reception signal is detected in a certain channel, the highspeed clock is changed into the lowspeed clock to be supplied to the microcomputer, whereby a reception signal is again detected. When no reception signal is detectable, the microcomputer recognizes that the detection of the reception signal under operation at the highspeed clock is caused by high frequency noises, and commences a searching operation of the next channel.

10 Claims, 10 Drawing Sheets

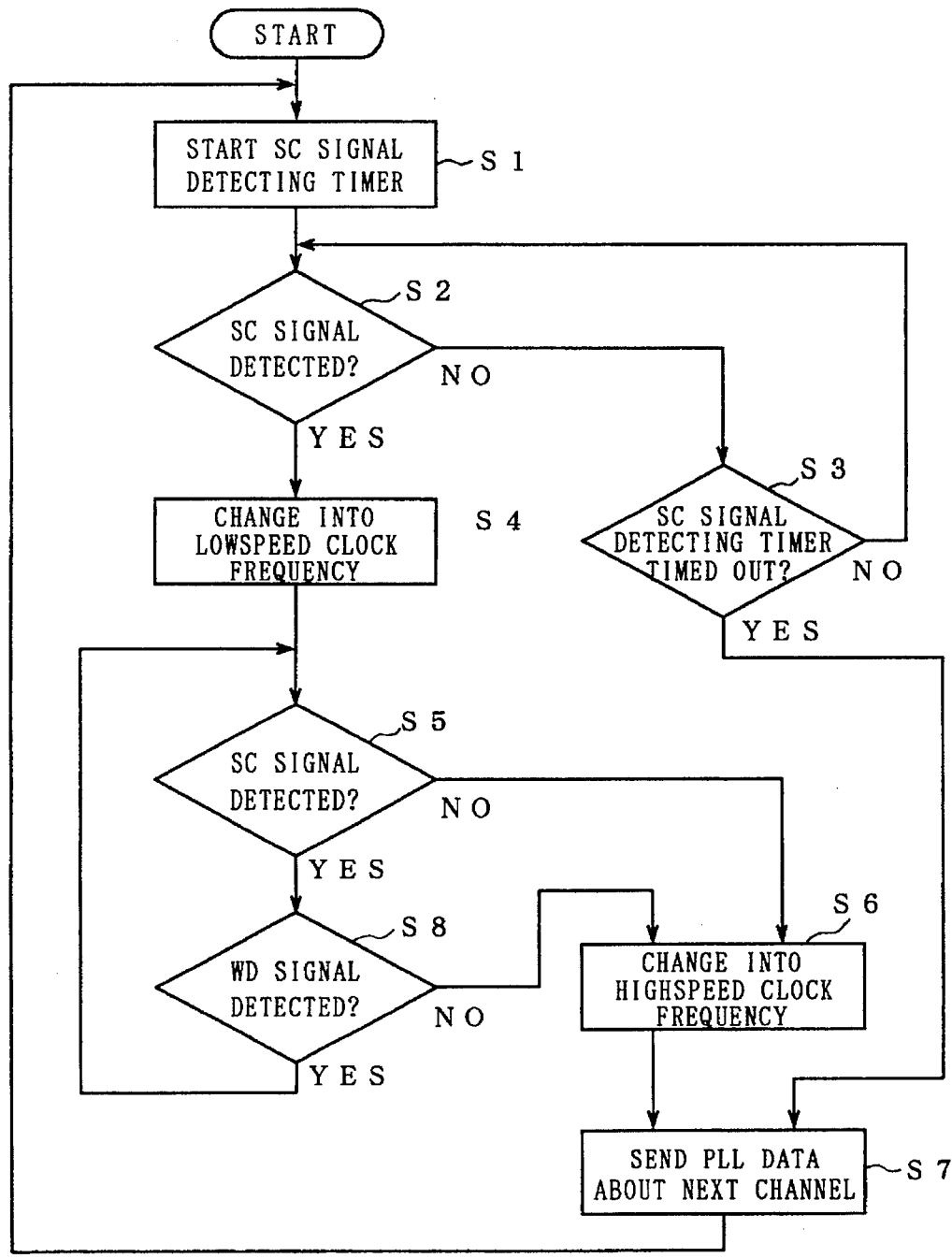
F I G. 7

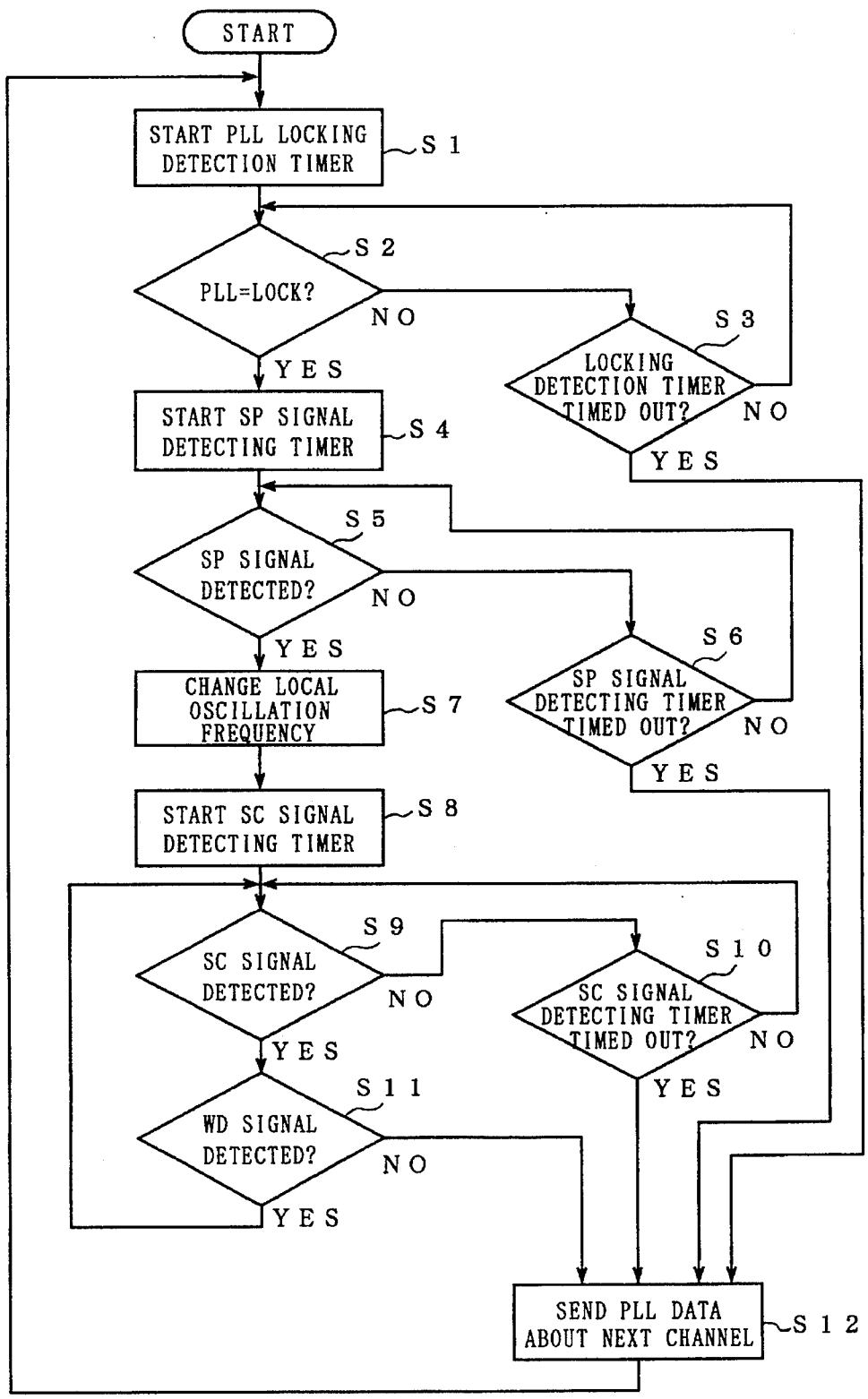
F I G. 1 1

CHANNEL SELECTING METHOD FOR RADIO RECEIVER AND HIGHSPEED SCANNING TYPE RADIO RECEIVER

BACKGROUND OF THE INVENTION

1. Field of the Invention

The present invention generally relates to a highspeed scanning type ratio receiver. More specifically, the present invention relates to a highspeed scanning type radio receiver capable of preventing erroneous interruptions of scanning operations caused by high frequency noises produced from a clock oscillator of a microcomputer, a local oscillator circuit used to a heterodyne reception, and other circuits.

2. Description of the Prior Art

In highspeed scanning type radio receivers for scanning channels at high speeds to perform channel selections, microcomputers are employed for control purposes. As clock oscillators used for microcomputers, such clock oscillators are widely utilized from which highspeed clocks are produced in order to scan channels at high speeds. Then, high frequency noises are generated from such highspeed clock oscillators. Further, when local oscillator circuits for heterodyne receptions are employed in highspeed scanning type radio receivers, high frequency noises are produced from the local oscillator circuits. Thus, these high frequency noises may cause erroneous interruptions of scanning operations during channel selections.

FIG. 1 represents a highspeed scanning type FM radio receiver with employment of frequency synthesizer type electronic tuning.

This FM radio receiver is arranged by an antenna 10, a radio receiving unit 12 containing a converter unit for converting a frequency of an FM radio signal received from the antenna 10 into an intermediate frequency thereof, a frequency discriminator 14 for converting a change in the intermediate frequencies of the intermediate frequency signals derived from the radio receiving unit 12, into a change in voltages, and a squelch circuit 16 for detecting whether or not the received signal is present based upon the output voltage from the frequency discriminator. The FM radio receiver further includes a window detector 22 for detecting whether or not a voltage corresponding to the center frequency of the intermediate frequency signal is output from the frequency discriminator 14, a audio frequency amplifier 18 for amplifying the output signal from the frequency discriminator 14, a speaker 20 for outputting the FM sound derived from the audio frequency amplifier 18, a frequency synthesizer 24 containing a phase-locked loop (PLL) circuit, a microcomputer (CPU) 26 for controlling operations of all circuit units, and a keyboard 28 for instructing the frequency synthesizer 24, and also a clock oscillator 30 for supplying clock signals to the CPU 26.

Typically, there are two scanning methods for such an FM radio receiver performed based upon response characteristics of the noise squelch circuit. The noise squelch circuit 16 compares the noise detecting voltage with the voltage "$V_{TH}$" set by a squelch controller (not shown) to produce the squelch control signal (will simply be referred to as "SC signal" hereinafter) when the noise detecting voltage is lower than the set voltage "$V_{TH}$", as shown in FIG. 2.

That is, a first scanning method corresponds to the normal scanning method. While a certain channel is scanned, when both of the SC signal is supplied from the squelch circuit 16 to the CPU 26 and the window signal (will be simply referred to as "WD signal" hereinafter) is supplied from the window detector 22 thereto, it is assumed that a desired signal can be received in this scanned channel, thereby interrupt this channel scanning operation. In accordance with this first scanning method, since the SC signal has not so fast, or quick response, a lengthy search time is required.

To the contrary, a second scanning method can realize a high-speed scanning operation. As represented in FIG. 3, in addition to the SC signal, another signal (will be simply referred to as "SP signal" hereinafter) is produced by detecting such a time instant when a change in the noise detecting voltages tends to be decreased (namely, portion "A" indicated by a dotted line of FIG. 3). Both of these SP signal and SC signal are utilized for the channel scanning operation. That is, in a channel where the SP signal is detected, the SC signal and the WD signal are detected, whereas in a channel where no SP signal is detected, the searching operation is advanced to the next channel. As a consequence, the overall scanning operation can be performed at high speeds. It should be noted that such a second scanning method will be called as a "turbo-scanning method".

Referring now to FIG. 4, the normal scanning method of this FM radio receiver shown in FIG. 1 will be described. It should be noted that FIG. 4 represents an operation flow of the CPU 26 for executing the operation of the normal scanning operation.

During the normal channel scanning operation, the CPU 26 sends PLL data about a certain channel to the frequency synthesizer 24. The frequency synthesizer 24 synthesizes a preselected frequency based on the PLL data and then sends the synthesized frequency to the radio receiving unit 12. The radio receiving unit 12 mixes the synthesized predetermined frequency derived from the radio receiver 12 with the frequency of the FM signal received via the antenna 10 by this radio receiving unit 12, thereby converting the frequency of the FM signal into the desirable intermediate frequency. The resultant intermediate frequency signal derived from the radio receiving unit 12 is supplied to the frequency discriminator 14. Then, the frequency discriminator 14 converts the intermediate frequency of this intermediate frequency signal into the voltage in accordance with the frequency-voltage converting characteristic, and supplies the voltage to the squelch circuit 16 and the window detector 22. The squelch circuit 16 produces the SC signal when the noise detecting voltage becomes lower than the set voltage $V_{TH}$. The window detector 22 produces the WD signal when the detection is made of the voltage corresponding to the center frequency of this intermediate frequency signal. In the normal scanning operation of FIG. 4, the CPU 26 starts an SC signal detecting timer (not shown in detail) so as to detect the SC signal derived from the squelch circuit 16 (step S1), thereby judging whether or not the SC signal is produced from the squelch circuit 16 (step S2). If no SC signal is detected and the SC detecting timer is not timed out (step S3), the scanning operation is returned to the previous step S2.

To the contrary, if the SC signal is detected at the step S2, then the CPU 26, judges whether or not the WD signal is produced from the window detector circuit 22 (step S4). When the window signal is detected, the CPU 26 makes such a judgement that the FM signal is received in this scanned channel, and cases this normal scanning operation. To the contrary, if no window signal is detected, then the CPU 26 sends the PLL data about the next channel to the frequency synthesizer 24 (step S5). When the SC signal detecting timer is brought into the time out state, the CPU 26 supplies the PLL data about the subsequent channel to the frequency synthesizer 24, so that the channel searching operation for the subsequent channel is commenced.

Referring now to FIG. 5, the above-described turbo-scanning method in the FM radio receiver will be described. FIG. 5 is a flow chart for explaining operations of the CPU 26 to execute the turbo-scanning method.

In the turbo-scanning operation, the CPU 26 starts a PLL (phase-locked loop) locking detection timer (step S1) and judges whether or not the PLL circuit of the frequency synthesizer 24 (step S2). If neither PLL locking operation is detected, nor the PLL locking detection timer is timed out (step S3), then the turbo-scanning process is again returned to the step S2. When the PLL locking operation (phenomenon) is detected at the step S2, an SP signal detection timer is commenced (step S4) to check whether or not the SP signal is detected (step S5). If the SP signal is not detected and the SP detection timer is not brought into the time out condition (step S6), then the turbo-scanning process is returned to the step S5.

At the step S5, when the SP signal is detected, the SC signal detection timer is started (step S7) to judge whether or not the SC signal is detected (step S8). When no SC signal is detected and the SC signal detection timer is not brought into the time out state (step S9), the turbo-scanning process is again returned to the step S8.

When the SC signal is detected at the step S8, a check is done whether or not the WD signal from the window detector circuit 22 is detected (step S10). If the WD signal is detected, then it may be judged a predetermined signal is received in this channel, so that the turbo-scanning operation is interrupted. If no WD signal is detected, then the PLL data about the next channel is supplied to the frequency synthesizer (step S11). At the steps S3, S6, S9, when the respective timers are timed out, the PLL data of the next channel is sent to the frequency synthesizer 24 (step S11).

To perform either the normal scanning, or the turbo-scanning at high speeds, the CPU 26 must be operated at high speeds. Therefore, high-speed clocks are required. In such a case, high frequency noises produced from the clock oscillator 30 may cause erroneous interruptions of the scanning operation. Also, in the receiver having the clock oscillator circuit, the clock oscillator circuit may function as a generating source for high frequency noises which similarly cause erroneous interruption of the scanning operation.

SUMMARY OF THE INVENTION

An object of the present invention is to provide a scanning method of a radio receiver capable of preventing an erroneous interruption of scanning operation even when high frequency noise is produced from a highspeed clock oscillator and a clock oscillator circuit.

Another object of the present invention is to provide a highspeed scanning type radio receiver capable of preventing an erroneous interruption of scanning operation.

According to one aspect of the present invention, in a radio receiver comprising a frequency synthesizer and a microcomputer for controlling this frequency synthesizer, a method for scanning a plurality of channels to select channels is comprised of the below-mentioned steps:

operating the microcomputer under a highspeed clock to control the frequency synthesizer, thereby scanning channels, and changing the highspeed clock for the microcomputer into a lowspeed clock when a reception signal is received in a certain scanned channel;

causing said microcomputer to be operated under said low-speed clock to again detect said reception signal in said channel where said reception signal has been received; and unless the reception signal is again detected, it being recognized that the detection of the reception signal in said certain channel is caused by high frequency noise, changing the lowspeed clock for the microcomputer into the highspeed clock to commence a search operation of the subsequent channel.

Also, according to another aspect of the present invention, in a radio receiver comprising first and second local oscillator circuits, a microcomputer for controlling these first and second local oscillator circuits, and a converting circuit for mixing an oscillation frequency derived one of said first and second local oscillator circuits with a reception frequency into an intermediate frequency, a method for scanning a plurality of channels to select channels comprises the steps of:

selecting said oscillation frequencies so as to satisfy the below-mentioned relation, assuming now that the oscillation frequencies of said first and second local oscillator circuits are "$f_{LO1}$" and "$f_{LO2}$" respectively, $$f_R - f_{LO1} = f_{IF},$$

$$f_{LO2} - f_R = f_{IF},$$

where symbol "$f_R$" denotes a reception frequency and symbol "$f_{IF}$" indicates an intermediate frequency:

operating said first local oscillator circuit to scan the local oscillator of said first local oscillator circuit;

upon reception of a reception signal in a certain channel, changing said first local oscillator circuit into said second local oscillator circuit to be operated;

in the channel where said reception signal is detected, again detecting a reception signal under the oscillation frequency of said changed second local oscillator circuit;

unless the reception signal is again detected, it being recognized that the detection of the reception signal in said channel is caused by high frequency noise, changing the second local oscillator circuit into the first local oscillator circuit to be operated, whereby a search operation of the subsequent channel is commenced.

Further, according to another aspect of the present invention, a highspeed scanning type radio receiver for scanning a plurality of channels to selects a channel, comprises:

oscillation frequency producing means for producing an oscillation frequency;

control means for controlling said oscillation frequency producing means to scan the channels and for judging whether or not a reception signal is present;

means for generating a highspeed clock with respect to said control means;

means for generating a lowspeed clock with respect to said control means; and means for switching said highspeed clock generating means and said low-speed clock generating means; wherein:

said control means is operated under said highspeed clock when said highspeed clock generating means is switched by said switching means to scan the channels; when a reception signal is received in a certain channel, said lowspeed clock generating means is switched by said switching means, thereby operating said control means under the lowspeed clock; another detection is performed to a reception signal in the channel where said reception signal is received; and unless the reception signal is detected, it is recognized that the detection of said reception signal in the channel is caused by high frequency noise, said highspeed clock generating means is switched by said switching means to commence a search operation of the subsequent channel.

Moreover, according to a further aspect of the present invention, a highspeed scanning type radio receiver for scanning a plurality of channels to select the channels, comprises:

first oscillation frequency generating means for generating a first oscillation frequency;

second oscillation frequency generating means for generating a second oscillation frequency;

converting means for mixing one of said first and second oscillation frequencies generated from said first and second oscillation frequency generating means with a reception frequency to convert the reception frequency into an intermediate frequency; and control means for controlling said first and second oscillation frequency generating means to scan the channels and for judging whether or not a reception signal is present; wherein when said control means scans the channels under said first oscillation frequency and detects the reception signal in a certain channel, said first oscillation frequency is switched to said second oscillation frequency; another detection of a reception signal is carried out under said switched second oscillation frequency; and unless the reception signal is received, it is recognized that the detection of the reception signal in the channel is caused by a high frequency noise, said second oscillation frequency is switched into said first oscillation frequency to commence a searching operation of the subsequent channel.

BRIEF DESCRIPTION OF THE DRAWINGS

FIG. 7 is a flow chart for representing the normal scanning operation effected in the FM radio receiver shown in FIG. 6;

FIG. 11 is a flow chart for indicating the turbo-scanning operation effected in the FM radio receiver of FIG. 9.

DESCRIPTION OF THE EXEMPLARY EMBODIMENTS

Figure 1:
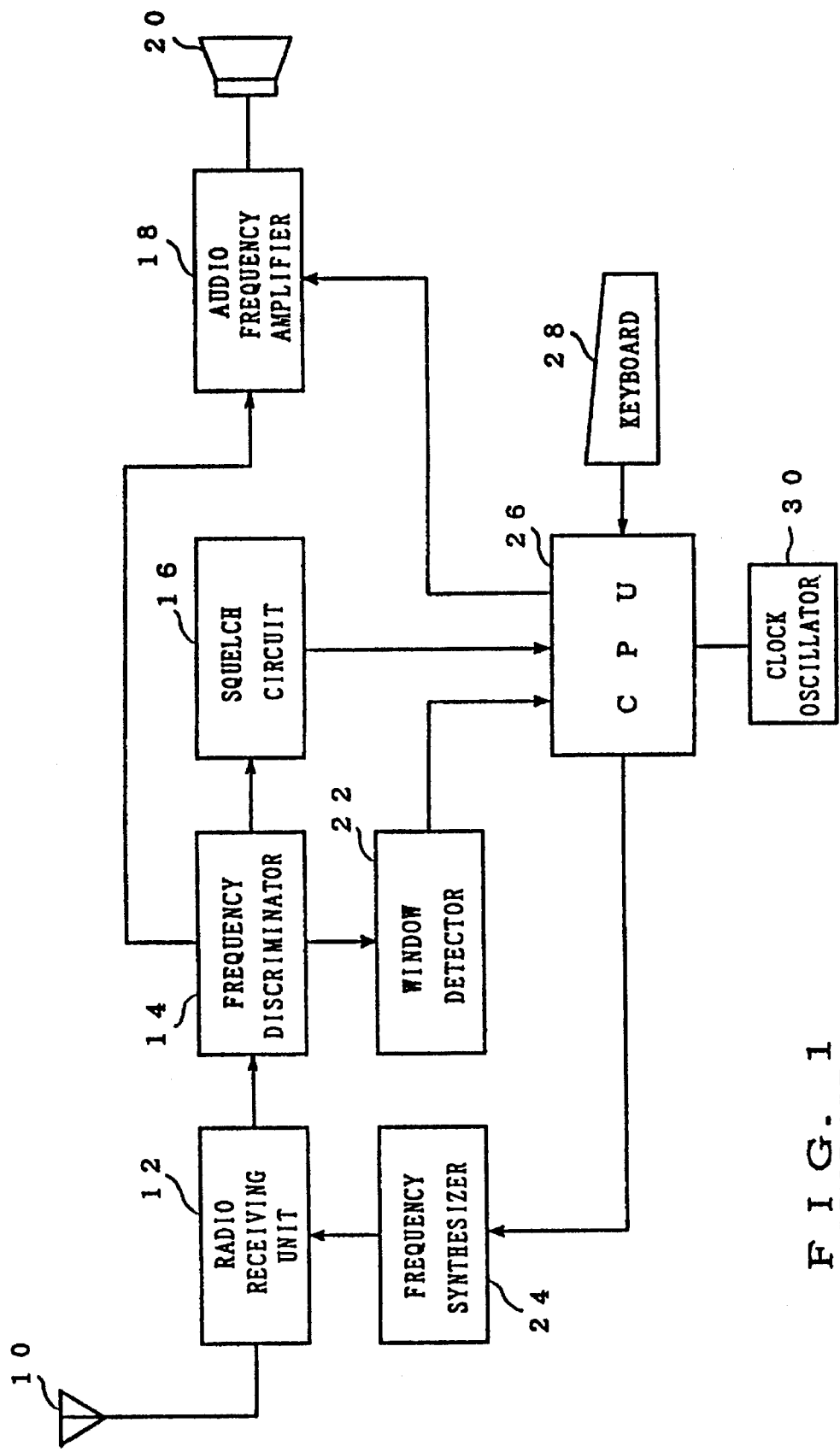
FIG. 1 is a schematic block diagram for representing an arrangement of a conventional FM radio receiver.
Figure 2:
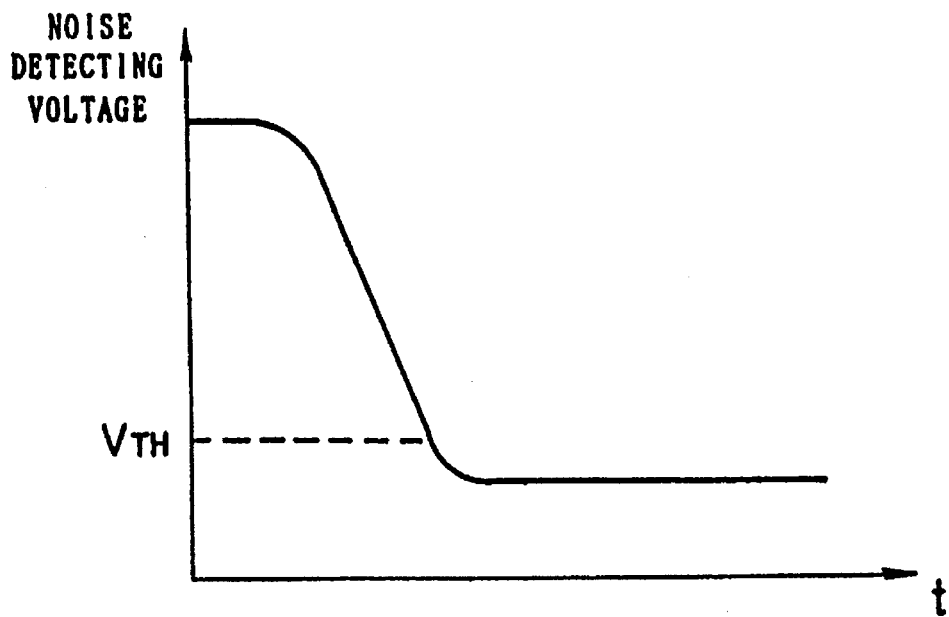
FIG. 2 is a waveform chart for explaining a generation of an SC signal.
Figure 3:
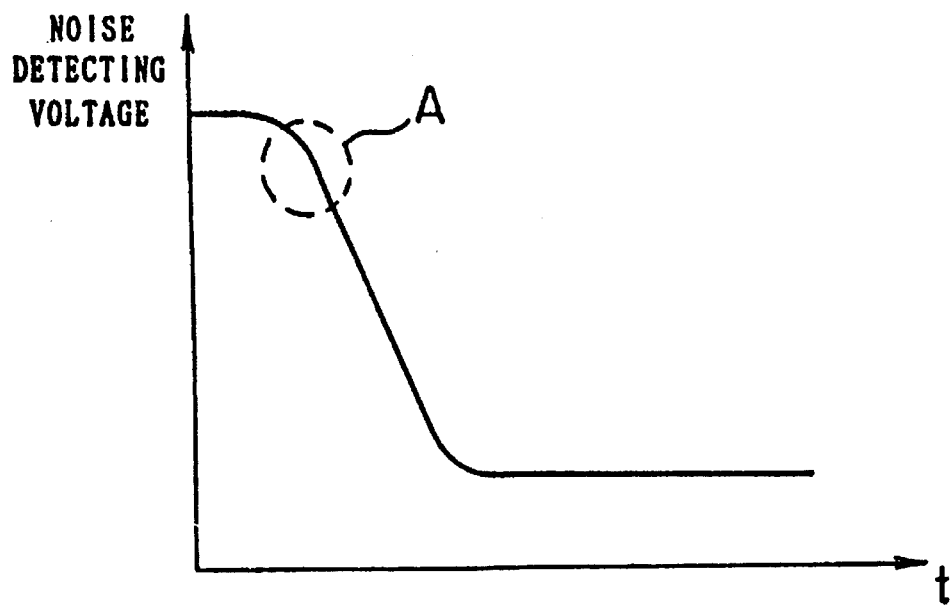
FIG. 3 is a waveform chart for explaining a generation of an SP signal.
Figure 4:
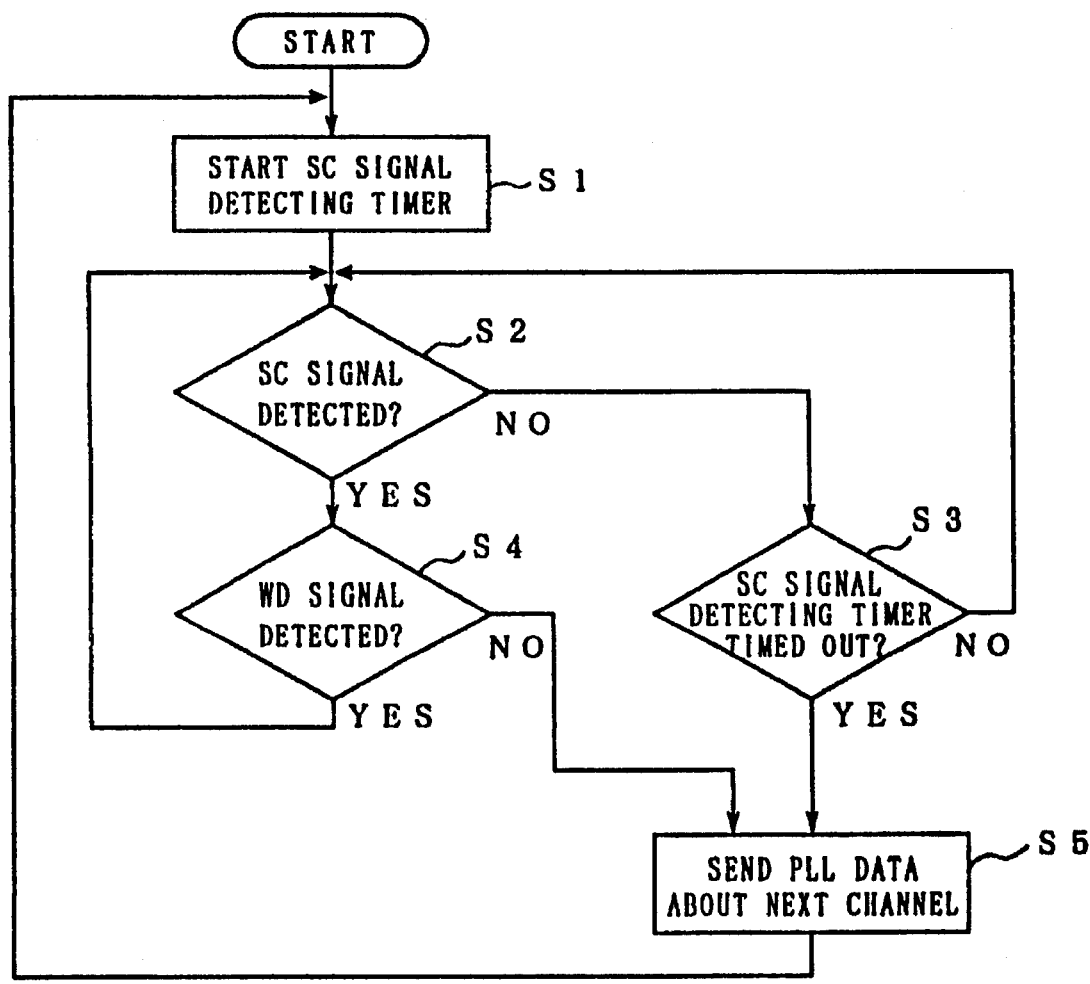
FIG. 4 is a flow chart for representing the normal scanning operation employed in the conventional FM radio receiver of FIG. 1.
Figure 5:
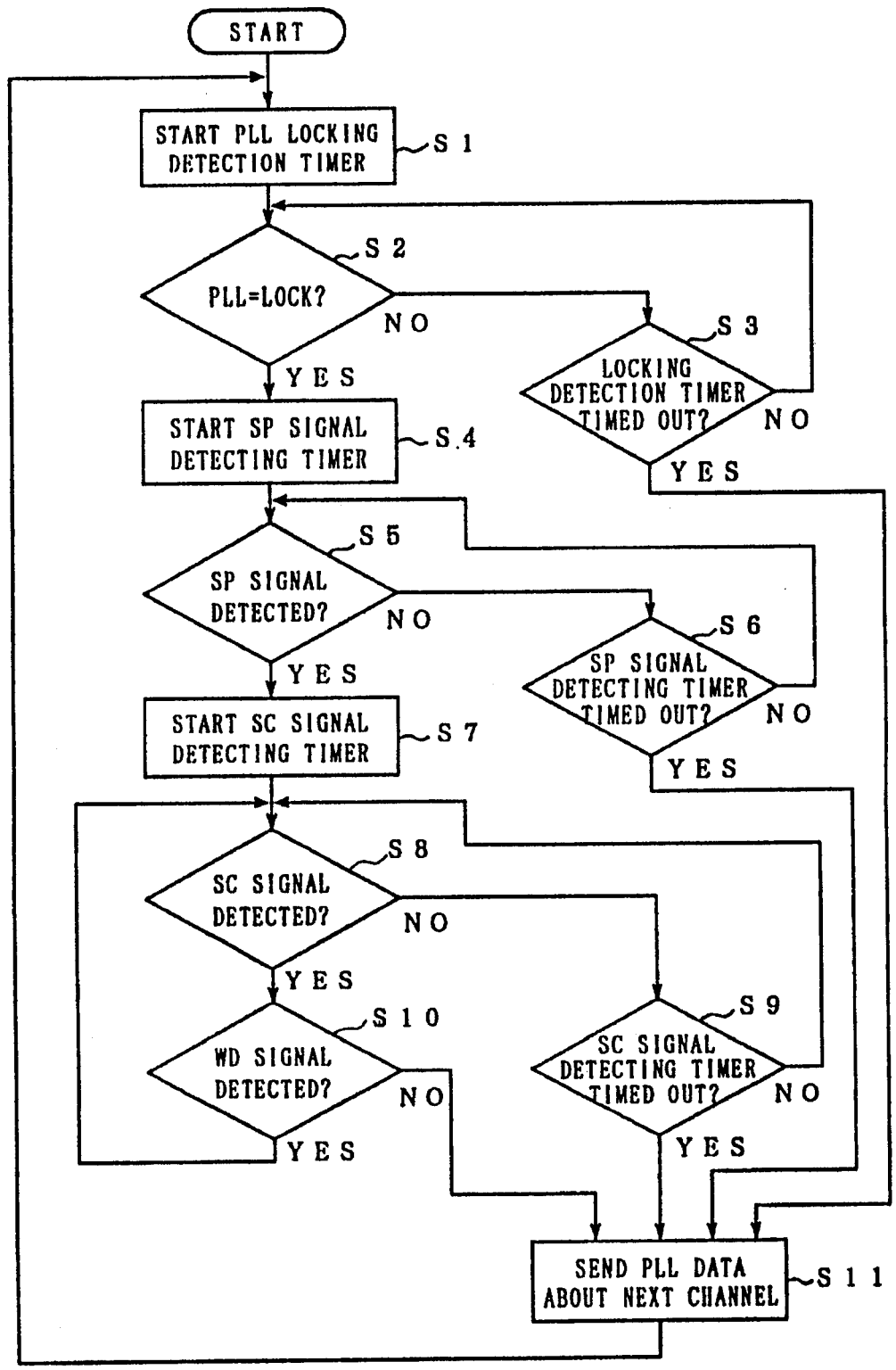
FIG. 5 is a flow chart for indicating the turbo-scanning operation employed in the conventional FM radio receiver of FIG.
Figure 6:
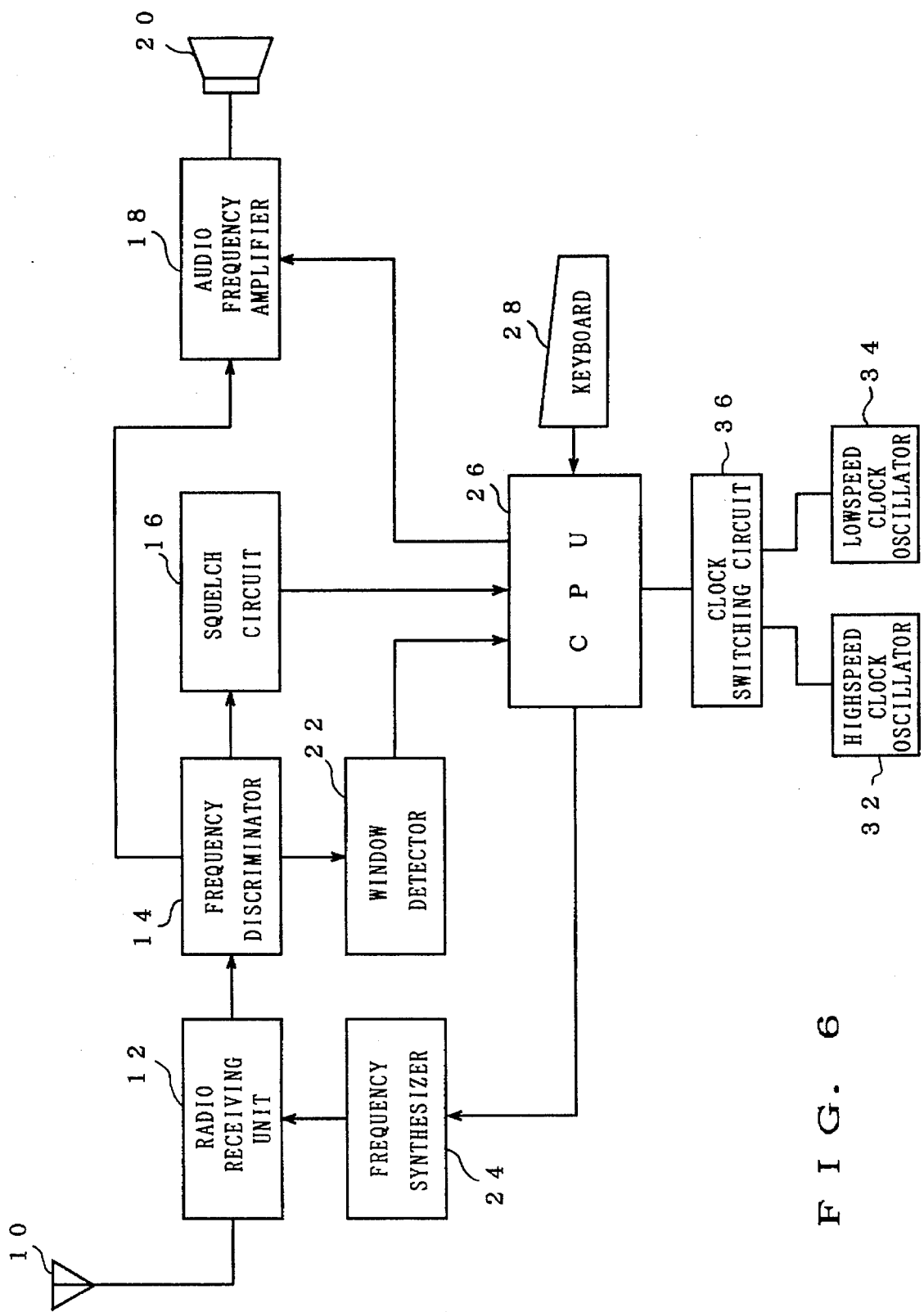
FIG. 6 is a schematic block diagram for representing an arrangement of an FM radio receiver, according to a first embodiment of the present invention, in which a highspeed clock and a lowspeed clock are switched.

FIG. 6 is a schematic block diagram for indicating an arrangement of a highspeed scanning type radio receiver with employment of a frequency synthesizer, according to a first embodiment of the present invention. It should be understood that the same reference numerals shown in FIG. 1 will be employed as those for denoting the same circuit elements shown in the following figures, and no further explanations thereof are made in this specification. A difference between this circuit arrangement of the first embodiment and the circuit arrangement of the conventional FM radio receiver shown in FIG. 1 is to newly employ a highspeed clock oscillator 32 for oscillating a highspeed clock, a lowspeed clock oscillator 34 for oscillating a lowspeed clock, and a clock switching circuit 36 for switching these highspeed clock and lowspeed clock to supply one of these clocks to the CPU 26.

Referring now to a flow chart of FIG. 7, a description will be made of a normal scanning operation performed in the FM radio receiver according to the first embodiment shown in FIG. 6.

It is now assumed that the clock switching circuit 36 switches the highspeed clock generator 32 to supply the highspeed clock to the CPU 26, so that this CPU 26 is operated under the highspeed clock. The CPU 26 commences an SC signal detection timer (not shown in detail) so as to detect the SC (squelch control) signal derived from the squelch detecting circuit 16 (step S1) and judges whether or not the SC signal is detected (step S2). If no SC signal is detected and the SC signal detecting timer is not brought into the time out state (step S3) and the normal scanning process is returned to the step S2.

When the SC signal is detected at this step S2, the CPU 26 instructs the clock switching circuit 36 to change the highspeed clock into the lowspeed clock (step S4), and again judge whether or not the SC signal is detected (step S5). If the SC signal is not detected, then the CPU 26 judges that the generation of such an SC signal is caused by high frequency noise produced from the highspeed clock oscillator 32. Thus, the CPU 26 instructs the clock switching circuit 36 to switch the lowspeed clock into the highspeed clock (step S6), and delivers PLL data about the subsequent channel to the frequency synthesizer 24 (step 7), thereby searching the subsequent channel. Also, when the SC signal detection timer is brought into the time out state, the CPU 26 sends the above-described PLL data about the next channel to the frequency synthesizer 24.

At the step S5, if the SC signal is detected, then the CPU 26 judges whether or not the window signal (WD signal) produced from the window detector circuit 22 is detected (step S8). When this WD signal is detected, the CPU 26 judges that a predetermined signal is received in this channel, and thus interrupts the scanning operation. To the contrary, when the WD signal is not detected, the normal scanning process is advanced to a step S6.

As previously described, in accordance with the first embodiment, normally the CPU 26 is operated under the highspeed clock to perform the highspeed scanning operation. When the SC signal is detected, also the WD signal is detected, the CPU 26 judges that a predetermined reception signal is received in this scanned channel. To the contrary, when no SC signal is detected, the CPU 26 judges that the generation of the SC signal under the highspeed clock is caused by the high frequency noise produced from the highspeed clock oscillator 32.

As a consequence, even when the highspeed clock oscillator causing such interference would be employed in the FM radio receiver, erroneous interruptions of the scanning operation caused by the high frequency noise would not occur. Thus, since the searching operation could be immediately commenced for the next channel, the highspeed searching operation could be realized by the CPU operated under the highspeed clock.

Figure 8:
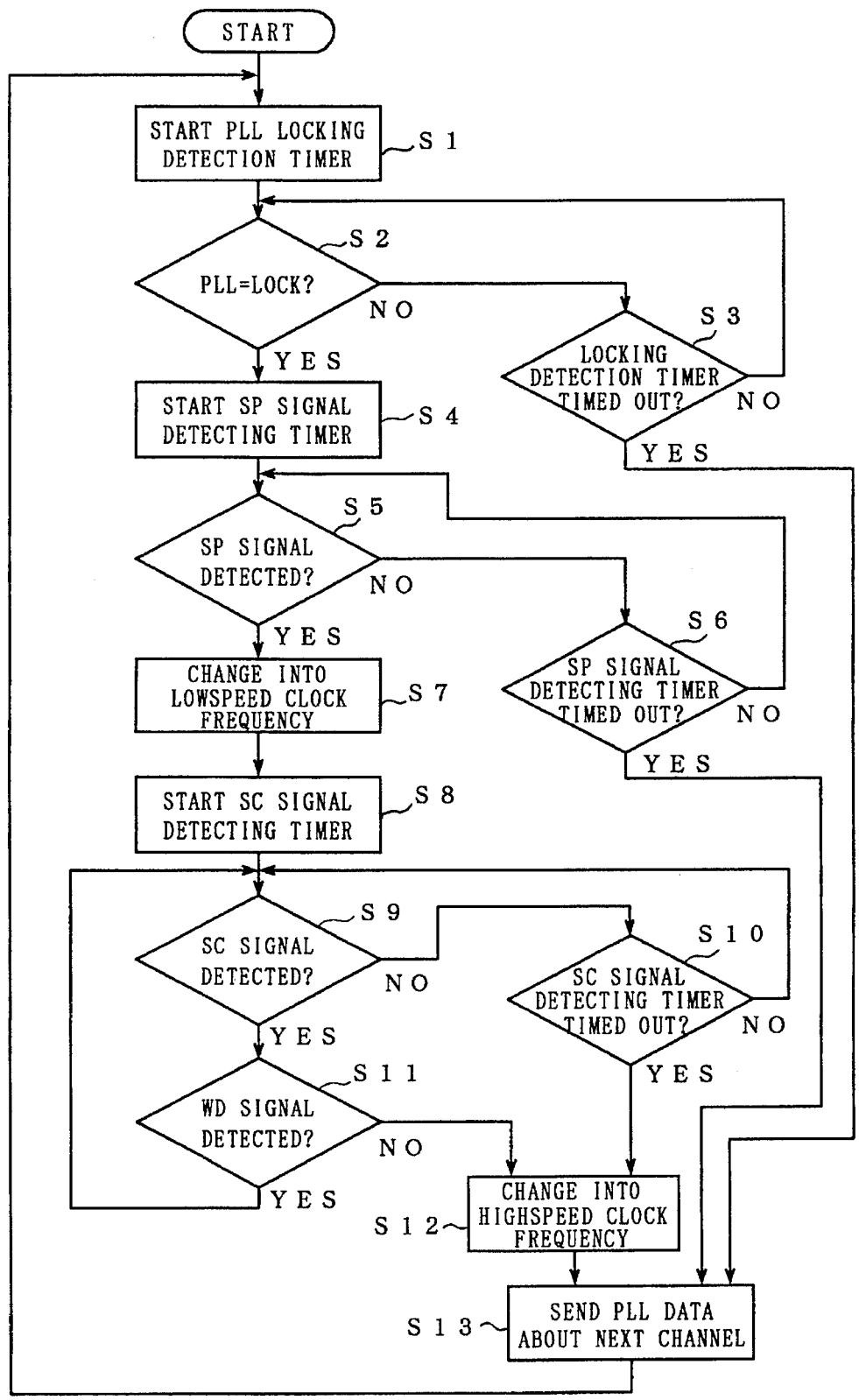
FIG. 8 is a flow chart for indicating the turbo-scanning operation performed in the FM radio receiver shown in FIG. 6.

Referring now to a flow chart of FIG. 8, a turbo-scanning operation by the highspeed scanning type radio receiver shown in FIG. 6 will be explained.

Assume now that the clock switching circuit 36 is switched to connect the highspeed clock oscillator 32 thereto, and the CPU 26 is operated under the highspeed clock. The CPU 26 starts a PLL locking detection timer (not shown in detail) (step S1) to check whether or not a PLL circuit (not shown either) of the frequency synthesizer 24 is locked (step S2). When no detection is made of the PLL locking state (phenomenon) and also the PLL locking detection timer is not brought into the time out state (step S3), the turbo-scanning process is returned to the previous step S2. When the PLL locking state is detected at the step S2, the CPU 26 commences an SP signal detecting timer (not shown) (step S4) to judges whether or not the SP signal is detected (step S5). If no SP signal is detected and the SP signal detecting timer is not brought into the time out state (step S6), then the turbo-scanning process is returned to the previous step S5.

At this step S5, when the SP signal is detected, the CPU 26 instructs the clock switching circuit 36 to switch the highspeed clock oscillator 32 into the lowspeed clock oscillator 34, so that the slowspeed clock is supplied via the clock switching circuit 36 to the CPU 26 and the SC signal detecting timer is started (step S8). Thus, the CPU 26 judges whether or not the SC signal is detected (step S9). If no SC signal is detected and the SC signal detecting timer is not timed out (step S10), then the turbo-scanning process is returned to the previous step S9.

When the SC signal is detected at the step S9, the CPU 26 judges whether or not the WD signal derived from the window detector circuit 22 is detected (step S11). If the WD signal is detectable, then the CPU 26 judges that a predetermined reception signal is received in this scanned channel and therefore interrupts the turbo-scanning operation. Conversely, if no WD signal is detectable, then the CPU 26 instructs the clock switching circuit 36 to switch the lowspeed clock oscillator 34 into the highspeed clock oscillator 32, thereby producing the highspeed clock (step S12). Then, the CPU 26 supplies the PLL data about the next channel to the frequency synthesizer 24 (step S13) so that the searching operation of the next channel is commenced. Also, when the respective timers are brought into the time out states at the steps S3 and S6, the CPU 26 transfers the PLL data about the subsequent channel to the frequency synthesizer 24 (step S13).

As previously explained, during the turbo-scanning operation of the first embodiment, the CPU 26 is operated under the highspeed clock to perform the highspeed scanning operation in the normal condition. When the SP signal is detected, the highspeed clock is changed into the lowspeed clock by switching the oscillation of the highspeed clock oscillator 32 into the oscillation of the lowspeed clock oscillator 34, and when the SC signal is detected and also the WD signal is detected, the CPU 26 judges that a predetermined reception signal is received in this channel. When no SC signal is detectable, the CPU 26 judges that the production of the SP signal under the highspeed clock is caused by the high frequency noise produced from the highspeed clock oscillator 32.

Accordingly, even when the highspeed clock oscillator causing such interference is employed, the erroneous interruptions of the scanning operations caused by the high frequency noises can be prevented, and the searching operation for the next channel can be immediately commenced, so that the highspeed scanning operation can be realized by way of the highspeed CPU operation in response to the highspeed clock.

Figure 9:
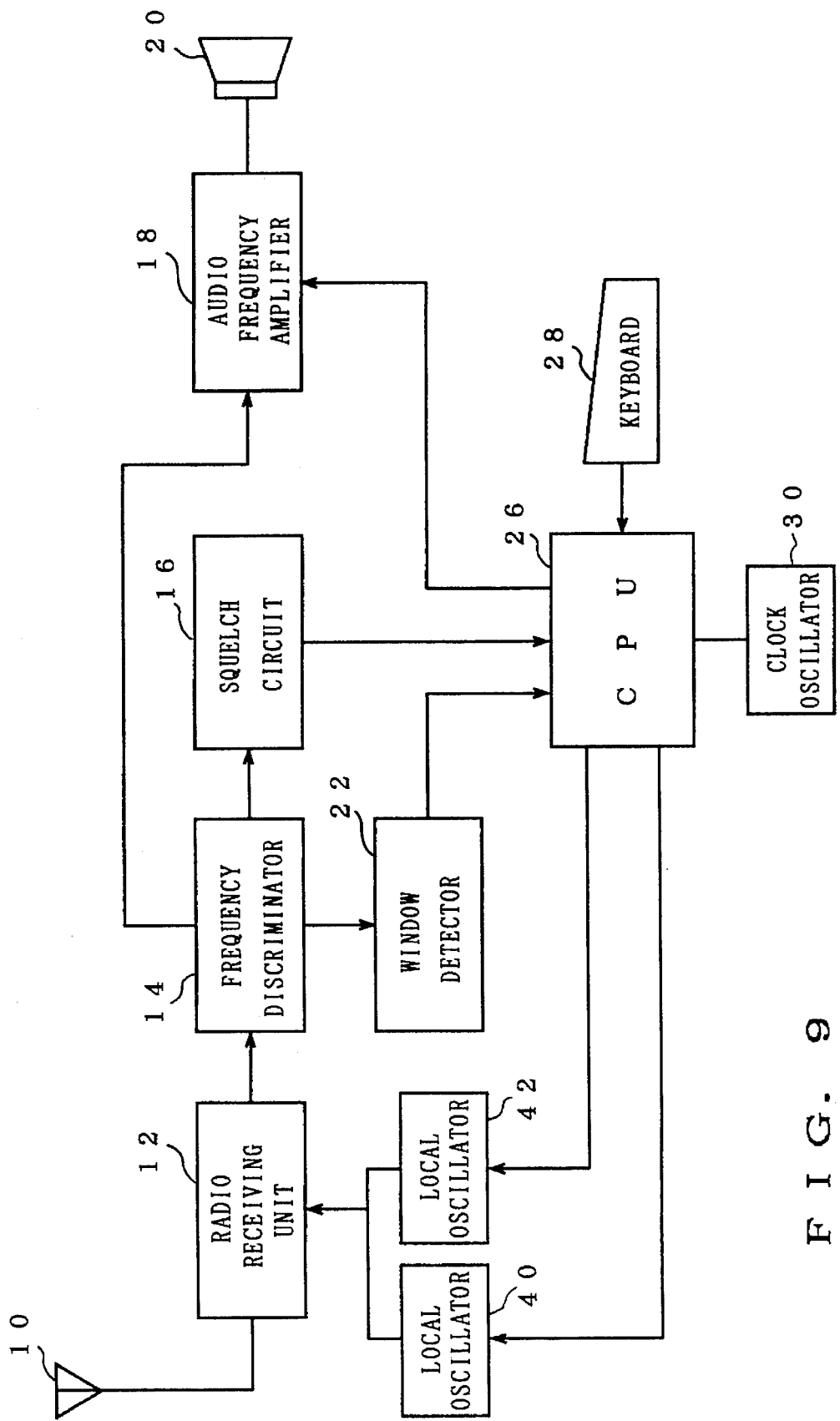
FIG. 9 is a schematic block diagram for showing an arrangement of another FM radio receiver, according to a second embodiment of the present invention, in which two local oscillator circuits are switched.

FIG. 9 is a schematic block diagram for showing an arrangement of another highspeed scanning type radio receiver with employment of local oscillator circuits, according to a second embodiment of the present invention. As apparent from FIG. 6, a major circuit arrangement of this second highspeed scanning type radio receiver is the same as that of the first highspeed scanning type radio receiver. That is, the highspeed scanning type radio receiver according to the second embodiment employs local oscillator circuits 40 and 42, instead of the above-described frequency synthesizer 24, and further a single clock oscillator circuit 30, instead of the above-mentioned highspeed/lowspeed oscillator circuits 32 and 34. These two local oscillator circuits 40 and 42 oscillate two different frequency signals. Assuming now that these two different oscillation frequencies are "$f_{LO1}$" and "$F_{LO2}$", respectively, these frequencies are selected so as to satisfy the following relationship:

$$f_R - f_{LO1} = f_{IF},$$

and $$f_{LO2} - f_R = F_{IF},$$

where symbol "$f_R$" indicates a frequency of a received carrier signal, and symbol "$f_{IF}$" denotes an intermediate frequency produced by converting the frequency of the received carrier signal by the converting unit of the radio receiving unit 12. As described above, the different local oscillation frequencies $f_{LO1}$ and $f_{LO2}$ from which the same intermediate frequencies are produced, may be switched. In other words, the upper heterodyne frequency and the lower heterodyne frequency are selectable.

Figure 10:
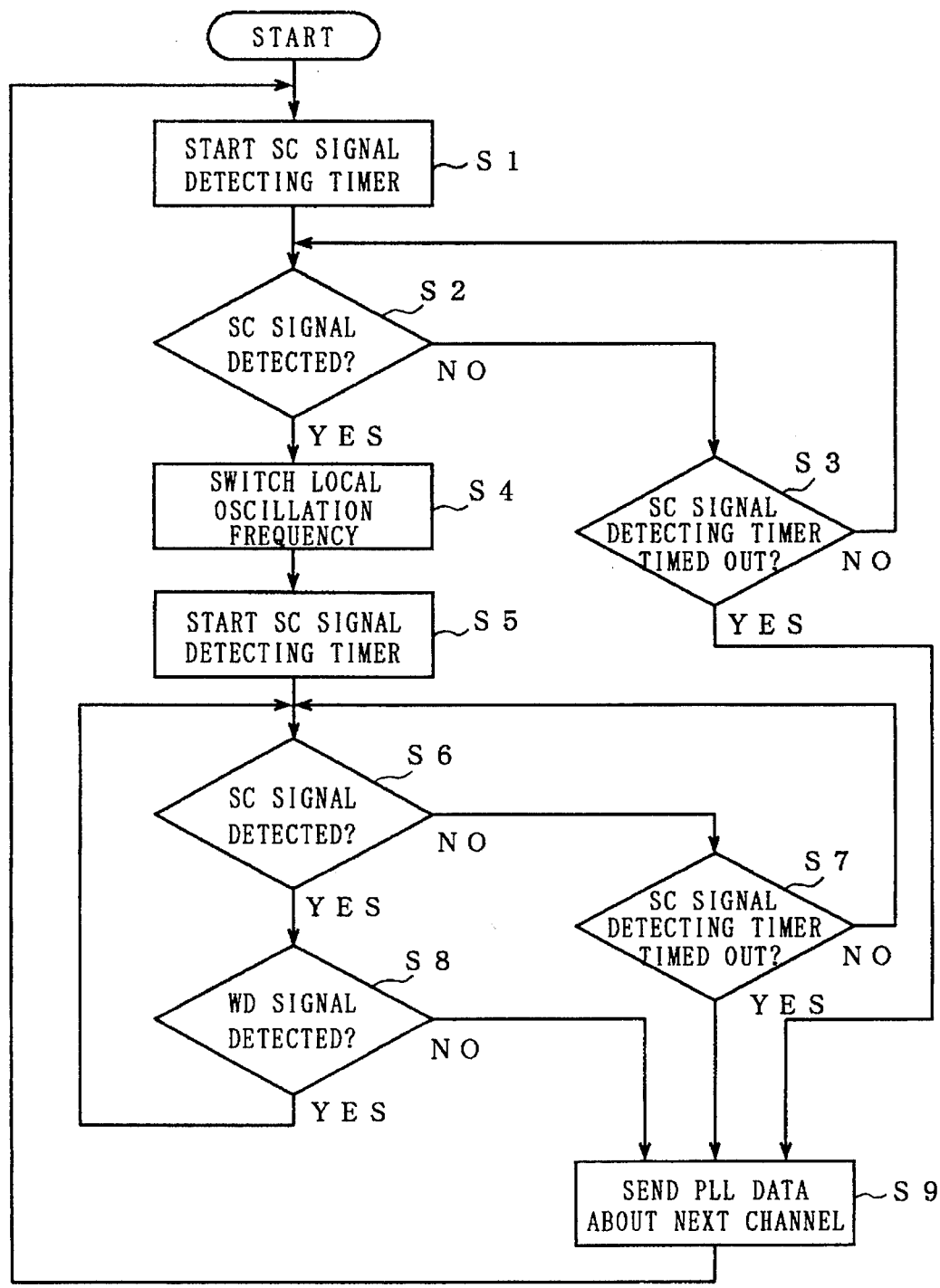
FIG. 10 is a flow chart for representing the normal scanning operation performed in the FM radio receiver of FIG. 9.

A normal scanning operation of the highspeed scanning type radio receiver according to the second embodiment will now be described with reference to a flow chart of FIG. 10.

In this normal scanning operation, it is now assumed that the CPU 26 furnishes the PLL data to one local oscillator circuit 40. At this time, to detect the SC signal produced from the squelch detecting circuit 16, the CPU 26 commences the SC signal detection timer (step S1), so that the CPU 26 judges whether or not the SC signal is detected (step S2). If no SC signal is detected and the SC signal detection timer is not brought into the time out state (step S3)0 then the normal scanning process is returned to the step S2.

When the SC signal is detected at the step S2, the local oscillator circuit 40 is changed into the local oscillator circuit 42 under control of the CPU 26 (step S4) and then the SC signal detecting timer is restarted (step S5). Thus, the CPU 26 judges whether or not the SC signal is detected (step S6). When the SC signal is not detected and the SC signal detecting timer is not brought into the time out state (step S7), the normal scanning process is returned to the step S6. When the SC signal detection timer is brought into the time out condition, the CPU 26 judges that the detection of the SC signal at the step S2 is caused by high frequency noises produced from the local oscillator circuits and/or the clock oscillator. Then, the CPU 26 supplies the PLL data about the next channel to the frequency synthesizer 24, so that the searching operation for the next channel is commenced (step S9).

When the SC signal is detected at the step S6, the CPU 26 judges whether or not the WD signal produced from the window detector circuit 22 is detected (step S8). If the WD signal is detectable, then the CPU 26 recognizes that a preselected reception signal is received in this scanned channel and interrupts the scanning operation.

Conversely, when the WD signal is not detectable at the step S8, the CPU 26 sends the PLL data about the subsequent channel to the frequency synthesizer 24 (step S9). When the SC signal detecting timer is brought into the time out state at the step S3, the CPU 26 transfers the PLL data about the next channel to the frequency synthesizer 24 (step S9).

As described above, in accordance with the normal scanning operation in the highspeed scanning type radio receiver with employment of the two local oscillator circuits 40 and 42, the channel searching operation is carried out by using one local oscillator circuit, and if the SC signal is detectable, then the presently operated local oscillator circuit is replaced by the other local oscillator circuit. Another judgement is made as to whether or not the SC signal is detectable. If the SC signal is again detectable and the WD signal is detectable, then the CPU recognizes that a predetermined reception signal is received in this scanned channel, whereby the channel scanning operation is stopped. Conversely, if no SC signal is detectable, then the CPU 26 judges that the generation of the SC signal established when one local oscillator circuit is operated, is caused by the high frequency noise, and therefore proceeds with the searching operation for the next channel.

Referring now to a flow chart of FIG. 11, a turbo-scanning operation of the highspeed scanning type radio receiver shown in FIG. 9 will be explained.

First, it is assumed that the CPU 26 delivers the PLL data to the local oscillator circuit 40. At this time, the CPU 26 starts the PLL locking detection timer (step S1) to judge whether or not the PLL circuit of this local oscillator circuit 40 is locked (step S2). When no PLL locking state is detected and the PLL locking detection timer is not brought into the time out state (step S3), this turbo-scanning process is returned to the step S2. When the PLL locking state is detected at the step S2, the CPU 26 commences the SP signal detecting timer (step S4) so as to judge whether or not the SP signal is detected (step S5). When no SP signal is detectable and the SP signal detecting timer is not brought into the time out condition (step S6), the turbo-scanning process is returned to the step S5.

When the SP signal is detected at the step S5, the local oscillator circuit 40 is changed into the local oscillator circuit 42 under control of the CPU 26 (step S7) and then the SC signal detecting timer is started (step S8). Thus, the CPU 26 judges whether or not the SC signal is detected (step S9). When the SC signal is not detected and the SC signal detecting timer is not brought into the time out state (step S10), the turbo-scanning process is returned to the step S9.

When the SC signal is detected at the step S9, the CPU 26 judges whether or not the WD signal produced from the window detector circuit 22 is detected (step S11). If the WD signal is detectable, then the CPU 26 recognizes that a preselected reception signal is received in this scanned channel and interrupts the scanning operation. If no SC signal is detected, then the CPU 26 judges that the generation of the SP signal at the step S5 is caused by high frequency noises produced from the local oscillator circuit and/or the clock oscillator, and therefore supplies the PLL data about the next channel to the local oscillator circuit 40, so that the searching operation of the next channel is commenced. If the respective timers are brought into the time out states at the steps S3. S6 and S10, then the CPU 26 furnishes the PLL data about the next channel to the local oscillator circuit 40 (step S12).

As described above, in accordance with the turbo-scanning operation in the highspeed scanning type radio receiver with employment of the two local oscillator circuits 40 and 42, the channel searching operation is carried out by using one local oscillator circuit, and if the SP signal is detectable, then the presently operated local oscillator circuit is replaced by the other local oscillator circuit. Another judgement is made as to whether or not the SC signal is detectable. If no SC signal is detectable, then the CPU 26 judges that the generation of the SC signal is caused by the high frequency noise, and therefore proceeds with the searching operation for the next channel.

Although the local oscillator circuits are employed to switch the local oscillation frequencies in the above-described embodiment, a frequency synthesizer may be employed instead thereof.

As previously explained above, according to the present invention, such an erroneous interruption caused by the high frequency noises produced from noise sources such as the highspeed clock oscillator and the local oscillator circuit, can be prevented, and the searching operation of the next channel can be immediately commenced, so that highspeed scanning operations can be realized.

The invention claimed is:

1. In a radio receiver comprising a frequency synthesizer and a microcomputer for controlling the frequency synthesizer, a method for scanning a plurality of channels to select one channel of the plurality of channels, comprising the steps of:

operating the microcomputer under a highspeed clock to control the frequency synthesizer, thereby scanning said plurality of channels, and changing the highspeed clock for the microcomputer into a lowspeed clock when a reception signal is initially detected in a certain scanned channel;

if said reception signal has been initially detected, causing said microcomputer to be operated under said lowspeed clock to finally detect said reception signal in said certain scanned channel of the plurality of channels; and if the reception signal is not finally detected, assuming that the initial detection of the reception signal in said certain scanned channel is caused by high frequency noise, changing the lowspeed clock for the microcomputer into the highspeed clock to commence a search operation of a subsequent channel in said plurality of channels.

2. In a radio receiver comprising first and second local oscillator circuits, a microcomputer for controlling these first and second local oscillator circuits, and a converting circuit for mixing one of a first oscillation frequency generated from said first local oscillator circuit and a second oscillation frequency generated from said second local oscillator circuit with a reception frequency to convert said reception frequency into an intermediate frequency, a method for scanning a plurality of channels to select one channel of the plurality of channels, comprising the steps of:

selecting said first and second oscillation frequencies so as to satisfy the below-mentioned relation, wherein the first and second oscillation frequencies of said first and second local oscillator circuits are designated by "$f_{L01}$" and "$f_L{}^{02}$" respectively, $$f_R - f_{L01} = F_{IF},$$

$f_{LO2}-f_R=f_{IF},$ where symbol "$f_R$" denotes the reception frequency and symbol "$f_{IF}$" indicates the intermediate frequency;

operating said first local oscillator circuit to scan the local oscillator of said first local oscillator circuit;

upon initial reception of a reception signal in a certain scanned channel of said plurality of channels, changing said first local oscillator circuit into said second local oscillator circuit to be operated;

in the certain scanned channel where said reception signal has been initially detected, finally detecting said reception signal responsive to the second oscillation frequency of said second local oscillator circuit; and if the reception signal is not finally detected, assuming that the initial detection of the reception signal in said certain scanned channel is caused by high frequency noise, changing the second local oscillator circuit into the first local oscillator circuit to be operated, whereby a search operation of a subsequent channel in said plurality of channels is commenced.

3. In a radio receiver comprising a frequency synthesizer for generating first and second oscillation frequencies different from each other, a microcomputer for controlling the frequency synthesizer, and a converting circuit for mixing the oscillation frequency generated from the frequency synthesizer with a reception frequency to convert said reception frequency into an intermediate frequency, a method for scanning a plurality of channels to select one channel of the plurality of channels, comprising the steps of:

selecting said first and second oscillation frequencies so as to satisfy the below-mentioned relation, wherein the first and second oscillation frequencies of said frequency synthesizer are designated by "$f_{LO1}$" and "$f_{LO2}$" respectively, $f_R-f_{LO1}=f_{IF},$ $f_{LO2}-f_R=f_{IF},$ where symbol "$f_R$" denotes the reception frequency and symbol "$f_{IF}$" indicates the intermediate frequency;

causing said frequency synthesizer to generate the first oscillation frequency to scan the plurality of channels;

causing said frequency synthesizer to generate the second oscillation frequency when a reception signal is initially detected in a certain scanned channel of the plurality of channels responsive to the first oscillation frequency;

in the certain scanned channel where said reception signal has been initially detected, finally detecting said reception signal responsive to said second oscillation frequency; and if the reception signal is not finally detected, assuming that the initial detection of the reception signal in said certain scanned channel is caused by high frequency noise, generating the first oscillation frequency from said frequency synthesizer, whereby a search operation of a subsequent channel in said plurality of channels is commenced.

4. A highspeed scanning type radio receiver for scanning a plurality of channels to select one channel of the plurality of channels, comprising:

oscillation frequency producing means for producing an oscillation frequency;

control means for controlling said oscillation frequency producing means to scan the plurality of channels and for determining whether or not a reception signal is present;

means for generating a highspeed clock with respect to said control means;

means for generating a lowspeed clock with respect to said control means; and means for switching said highspeed clock generating means and said lowspeed clock generating means; wherein:

said control means is operated under said highspeed clock when said highspeed clock generating means is switched by said switching means to scan the plurality of channels;

when a reception signal is initially received in a certain scanned channel of said plurality of channels, said lowspeed clock generating means is switched by said switching means, thereby operating said control means under the lowspeed clock;

another detection is performed to finally detect said reception signal in the certain scanned channel; and if the reception signal is not finally detected, assuming that the initial detection of said reception signal in said certain scanned channel is caused by high frequency noise, said highspeed clock generating means is switched by said switching means to commence a search operation of a subsequent channel in said plurality of channels.

5. A highspeed scanning type radio receiver for scanning a plurality of channels to select one channel of the plurality of channels, comprising:

first oscillation frequency generating means for generating a first oscillation frequency:

second oscillation frequency generating means for generating a second oscillation frequency;

converting means for mixing one of said first and second oscillation frequencies generated from said first and second oscillation frequency generating means with a reception frequency to convert the reception frequency into an intermediate frequency; and control means for controlling said first and second oscillation frequency generating means to scan the plurality of channels and for determining whether or not a reception signal is present;

control means for scanning the plurality of channels responsive to said first oscillation frequency, for initially detecting the reception signal in a certain scanned channel of said plurality of channels, and for switching said first oscillation frequency to said second oscillation frequency; and means for finally detecting said reception signal responsive to said switched second oscillation frequency;

wherein, if the reception signal is not finally detected responsive to said switched second oscillation frequency, assuming that the initial detection of said reception signal in said certain scanned channel is caused by high frequency noise, said control means switches from said second oscillation frequency to said first oscillation frequency to commence a searching operation of a subsequent channel in said plurality of channels.

6. A highspeed scanning type radio receiver as claimed in claim 5, wherein said first and second oscillation frequency generating means are constructed of a single oscillation frequency generating means.

7. A highspeed scanning type radio receiver for scanning a plurality of channels to select one channel of the plurality of channels, comprising:

a frequency synthesizer including a phase-locked loop (PLL) circuit;

a radio receiving unit for mixing a reception signal with an oscillation frequency signal generated from the frequency synthesizer to convert a frequency of the reception signal into an intermediate frequency signal;

a frequency discriminator for converting a change in frequency of the intermediate frequency signal derived from the radio receiving unit into a change in voltage;

a squelch circuit for detecting whether or not the reception signal is present based on an output signal derived from the frequency discriminator, and for producing a squelch control (SC) signal upon detection of noise in the reception signal being below a predetermined threshold;

a microcomputer for controlling said frequency synthesizer based on the SC signal derived from the squelch circuit;

a highspeed clock oscillator for generating a highspeed clock signal to be supplied to said microcomputer;

a lowspeed clock oscillator for generating a lowspeed clock signal to be supplied to said microcomputer; and, a switching circuit for switching between said highspeed clock oscillator and said lowspeed clock oscillator, wherein:

said microcomputer is operated responsive to the highspeed clock oscillator when said switching circuit switches said highspeed clock oscillator to be operable, and supplies PLL data to said frequency synthesizer so as to scan the plurality of channels;

when the SC signal from the squelch circuit is initially detected in a certain scanned channel, said switching circuit switches said lowspeed clock oscillator to be operable, whereby said microcomputer is operated under the lowspeed clock;

said microcomputer finally detects the SC signal from the squelch circuit in the certain scanned channel where said SC signal is detected responsive to the lowspeed clock oscillator; and when no SC signal is finally detected, the microcomputer determines that the initial detection of the SC signal in said certain scanned channel is caused by high frequency noise, and instructs said switching circuit to switch said highspeed clock oscillator to be operable, whereby a searching operation for a subsequent channel in said plurality of channels is commenced.

8. A highspeed scanning type radio receiver for scanning a plurality of channels to select one channel of the plurality of channels, comprising:

a frequency synthesizer including a phase-locked loop (PLL) circuit;

a radio receiving unit for mixing a reception signal with an oscillation frequency signal generated from the frequency synthesizer to convert a frequency of the reception signal into an intermediate frequency signal;

a frequency discriminator for converting a change in frequency of the intermediate frequency signal derived from the radio receiving unit into a change in voltage;

a squelch circuit for detecting whether or not the reception signal is present based on an output signal derived from the frequency discriminator, and for producing an SP signal representing a decrease in noise in the output signal of the frequency discriminator and subsequently a squelch control (SC) signal, representing a decrease in noise in the output signal of the frequency discriminator below a predetermined threshold, and having a response slower than that of said SP signal, upon detection of said reception signal;

a microcomputer for controlling said frequency synthesizer based on the SP signal and the SC signal derived from the squelch circuit;

a highspeed clock oscillator for generating a highspeed clock signal to be supplied to said microcomputer;

a lowspeed clock oscillator for generating a lowspeed clock signal to be supplied to said microcomputer and, a switching circuit for switching between said highspeed clock oscillator and said lowspeed clock oscillator, wherein:

said microcomputer is operated under the highspeed clock when said switching circuit switches said highspeed clock oscillator to be operable, and supplies PLL data to said frequency synthesizer so as to scan the plurality of channels;

when the SP signal from the squelch circuit is initially detected in a certain scanned channel of the plurality of channels, said switching circuit switches said lowspeed clock oscillator to be operable, whereby said microcomputer is operated under the lowspeed clock;

said microcomputer finally detects the SC signal from the squelch circuit in the certain scanned channel where said SP signal is detected; and when no SC signal is finally detected, the microcomputer determines that the initial detection of the SP signal in said certain scanned channel is caused by high frequency noise, and instructs said switching circuit to switch said highspeed clock oscillator to be operable, whereby a searching operation for a subsequent channel in said plurality of channels is commenced.

9. A highspeed scanning type radio receiver for scanning a plurality of channels to select one channel of the plurality of channels, comprising:

a first local oscillator circuit for generating a first oscillation frequency;

a second local oscillator circuit for generating a second oscillation frequency;

a radio receiving unit for mixing a reception signal with an oscillation frequency signal generated from one of said first and second oscillator circuits to convert a reception frequency of the reception signal into an intermediate frequency signal;

a frequency discriminator for converting a change in frequency of the intermediate frequency signal derived from the radio receiving unit into a change in voltage;

a squelch circuit for detecting whether or not the reception signal is present based on an output voltage derived from the frequency discriminator, and for producing a squelch control (SC) signal upon detection of noise in the reception signal being below a predetermined threshold; and a microcomputer for controlling said frequency synthesizer based on the SC signal derived from the squelch circuit; wherein:

said first and second oscillation frequencies are selected so as to satisfy the below-mentioned relation, wherein said first and second local oscillation frequencies are designated by "$f_{LO1}$" and "$f_{LO2}$" respectively, $$f_R - f_{LO1} = F_{IF},$$

$$f_{LO2} - f_R = f_{IF},$$

where symbol "$f_R$" denotes the reception frequency and symbol "$f_{IF}$" indicates the intermediate frequency;

said microcomputer scans the plurality of channels responsive to said first oscillation frequency;

when the SC signal from said squelch circuit is initially detected in a certain scanned channel, said first oscillation frequency is changed into said second oscillation frequency;

said computer, responsive to the second oscillation frequency, finally detects the SC signal in the certain scanned channel where said SC signal is detected responsive to the first oscillation frequency; and when no SC signal is finally detected, the microcomputer determines that the initial detection of the SC signal in said certain scanned channel is caused by high frequency noise, changes said second oscillation frequency into said first oscillation frequency, and commences a searching operation for a subsequent channel in said plurality of channels.

10. A highspeed scanning type radio receiver for scanning a plurality of channels to select one channel of the plurality of channels, comprising:

a first local oscillator circuit for generating a first oscillation frequency;

a second local oscillator circuit for generating a second oscillation frequency;

a radio receiving unit for mixing a reception signal with an oscillation frequency signal generated from one of said first and second local oscillator circuits to convert a reception frequency of the reception signal into an intermediate frequency signal;

a frequency discriminator for converting a change in frequency of the intermediate frequency signal derived from the radio receiving unit into a change in voltage;

a squelch circuit for detecting whether or not the reception signal is present based on an output signal derived from the frequency discriminator, and for producing an SP signal representing a decrease in noise in the output signal of the frequency discriminator and subsequently a squelch control (SC) signal, representing a decrease in noise in the output signal of the frequency discriminator below a predetermined threshold, and having a response slower than that of said SP signal, upon detection of the reception signal; and a microcomputer for controlling said frequency synthesizer based on the SC signal and the SP signal derived from the squelch circuit; wherein:

said first and second oscillation frequencies are selected so as to satisfy the below-mentioned relation; wherein said first and second local oscillation frequencies are designated by "$f_{LO1}$" and "$f_{LO2}$" respectively, $$f_R - f_{LO1} = f_{IF},$$

$$f_{LO2} - f_R = f_{IF},$$

where symbol "$f_R$" denotes the reception frequency and symbol "$f_{IF}$" indicates the intermediate frequency;

said microcomputer scans the plurality of channels under said first oscillation frequency;

when the SP signal from said squelch circuit is initially detected in a certain scanned channel of the plurality of channels, said first oscillation frequency is changed into said second oscillation frequency;

said computer finally detects the SC signal in the certain scanned channel where said SP signal is detected; and when no SC signal is finally detected, the microcomputer judges that the initial detection of the SP signal in said certain scanned channel is caused by high frequency noise, changes said second oscillation frequency into said first oscillation frequency, and commences a searching operation for subsequent channel in said plurality of channels.

* * * * *

UNITED STATES PATENT AND TRADE MARK OFFICE
CERTIFICATE OF CORRECTION

PATENT NO.    : 5,471,660
DATED         : November 28, 1995
INVENTOR(S)   : Tateo Masaki It is certified that error appears in the above-identified patent and that said Letters Patent is hereby corrected as shown below:

Column 10, line 65, claim 2, delete "$f_L{}^{02}$" and insert -- $f_{L}02$ --.

Column 16, line 40, claim 10, before "subsequent" insert --a--.

Signed and Sealed this

Twenty-first Day of May, 1996

Attest:

BRUCE LEHMAN

*Attesting Officer*    *Commissioner of Patents and Trademarks*